(12) United States Patent
Golda et al.

(10) Patent No.: US 8,556,389 B2
(45) Date of Patent: Oct. 15, 2013

(54) LOW-PROFILE MEMS THERMAL PRINTHEAD DIE HAVING BACKSIDE ELECTRICAL CONNECTIONS

(75) Inventors: Dariusz Golda, Menlo Park, CA (US); Hyeun-Su Kim, Palo Alto, CA (US); Valerie Gassend, San Carlos, CA (US)

(73) Assignee: Kateeva, Inc., Menlo Park, CA (US)

( * ) Notice: Subject to any disclaimer, the term of this patent is extended or adjusted under 35 U.S.C. 154(b) by 212 days.

(21) Appl. No.: 13/154,419

(22) Filed: Jun. 6, 2011

(65) Prior Publication Data
US 2012/0200640 A1  Aug. 9, 2012

Related U.S. Application Data

(60) Provisional application No. 61/439,816, filed on Feb. 4, 2011.

(51) Int. Cl.
*B41J 2/05* (2006.01)

(52) U.S. Cl.
USPC .................................. 347/59; 347/58; 347/63

(58) Field of Classification Search
USPC ........... 347/20, 44, 46, 47, 50, 56–59, 61–65, 347/67
See application file for complete search history.

(56) References Cited

U.S. PATENT DOCUMENTS

| | | |
|---|---|---|
| 4,238,807 A | 12/1980 | Bovio et al. |
| 4,751,531 A | 6/1988 | Saito et al. |
| 5,041,161 A | 8/1991 | Cooke et al. |
| 5,116,148 A | 5/1992 | Ohara et al. |
| 5,155,502 A | 10/1992 | Kimura et al. |
| 5,172,139 A | 12/1992 | Sekiya et al. |
| 5,202,659 A | 4/1993 | DeBonte et al. |
| 5,247,190 A | 9/1993 | Friend et al. |
| 5,405,710 A | 4/1995 | Dodabalapur et al. |
| 5,574,485 A | 11/1996 | Anderson et al. |

(Continued)

FOREIGN PATENT DOCUMENTS

| | | |
|---|---|---|
| EP | 1 626 103 | 2/2006 |
| JP | 06-122201 | 5/1994 |

(Continued)

OTHER PUBLICATIONS

Chen et al., "Evaporative Deposition of Molecular Organics in Ambient with a Molecular Jet Printer," *Digital Fabrication*, Sep. 2006, pp. 63-65 (Abstract only).

(Continued)

*Primary Examiner* — Juanita D Jackson

(57) ABSTRACT

A thermal printhead die is formed from an SOI structure as a MEMS device. The die has a printing surface, a buried oxide layer, and a mounting surface opposite the printing surface. A plurality of ink delivery sites are formed on the printing surface, each site having an ink-receiving and ink-dispensing structure. An ohmic heater is formed adjacent to each structure, and an under-bump metallization (UBM) pad is formed on the mounting surface and is electrically connected to the ohmic heater, so that ink received by the ink-delivery site and electrically heated by the ohmic heater may be delivered to a substrate by sublimation. A through-silicon-via (TSV) plug may be formed through the thickness of the die and electrically coupled through the buried oxide layer from the ohmic heater to the UBM pad. Layers of interconnect metal may connect the ohmic heater to the UBM pad and to the TSV plug.

10 Claims, 7 Drawing Sheets

(56) References Cited

U.S. PATENT DOCUMENTS

| | | | |
|---|---|---|---|
| 5,623,292 A | 4/1997 | Shrivasta | |
| 5,703,436 A | 12/1997 | Forrest et al. | |
| 5,707,745 A | 1/1998 | Forrest et al. | |
| 5,731,828 A | 3/1998 | Ishinaga et al. | |
| 5,781,210 A | 7/1998 | Hirano et al. | |
| 5,801,721 A | 9/1998 | Gandy et al. | |
| 5,834,893 A | 11/1998 | Bulovic et al. | |
| 5,844,363 A | 12/1998 | Gu et al. | |
| 5,865,860 A | 2/1999 | Delnick | |
| 5,947,022 A | 9/1999 | Freeman et al. | |
| 5,956,051 A | 9/1999 | Davies et al. | |
| 6,013,982 A | 1/2000 | Thompson et al. | |
| 6,065,825 A | 5/2000 | Anagnostopoulos et al. | |
| 6,086,195 A | 7/2000 | Bohorquez et al. | |
| 6,086,196 A | 7/2000 | Ando et al. | |
| 6,086,679 A | 7/2000 | Lee et al. | |
| 6,087,196 A | 7/2000 | Sturm et al. | |
| 6,091,195 A | 7/2000 | Forrest et al. | |
| 6,095,630 A | 8/2000 | Horii et al. | |
| 6,097,147 A | 8/2000 | Baldo et al. | |
| 6,189,989 B1 | 2/2001 | Hirabayashi et al. | |
| 6,250,747 B1 | 6/2001 | Hauck | |
| 6,257,706 B1 | 7/2001 | Ahn | |
| 6,294,398 B1 | 9/2001 | Kim et al. | |
| 6,303,238 B1 | 10/2001 | Thompson et al. | |
| 6,312,083 B1 | 11/2001 | Moore | |
| 6,326,224 B1 | 12/2001 | Xu et al. | |
| 6,337,102 B1 | 1/2002 | Forrest et al. | |
| 6,431,702 B2 | 8/2002 | Ruhe | |
| 6,444,400 B1 | 9/2002 | Cloots et al. | |
| 6,453,810 B1 | 9/2002 | Rossmeisl et al. | |
| 6,460,972 B1 | 10/2002 | Trauernicht et al. | |
| 6,468,819 B1 | 10/2002 | Kim et al. | |
| 6,472,962 B1 | 10/2002 | Guo et al. | |
| 6,498,802 B1 | 12/2002 | Chu et al. | |
| 6,513,903 B2 | 2/2003 | Sharma et al. | |
| 6,548,956 B2 | 4/2003 | Forrest et al. | |
| 6,562,405 B2 | 5/2003 | Eser et al. | |
| 6,576,134 B1 | 6/2003 | Agner | |
| 6,586,763 B2 | 7/2003 | Wang et al. | |
| 6,601,936 B2 | 8/2003 | McDonald | |
| 6,666,548 B1 | 12/2003 | Sadasivan et al. | |
| 6,811,896 B2 | 11/2004 | Aziz et al. | |
| 6,824,262 B2 | 11/2004 | Kubota et al. | |
| 6,861,800 B2 | 3/2005 | Tyan et al. | |
| 6,871,942 B2 * | 3/2005 | Emery et al. | 347/59 |
| 6,896,346 B2 | 5/2005 | Trauernicht et al. | |
| 6,911,671 B2 | 6/2005 | Marcus et al. | |
| 6,917,159 B2 | 7/2005 | Tyan et al. | |
| 6,982,005 B2 | 1/2006 | Eser et al. | |
| 7,023,013 B2 | 4/2006 | Ricks et al. | |
| 7,077,513 B2 | 7/2006 | Kimura et al. | |
| 7,247,394 B2 | 7/2007 | Hatwar et al. | |
| 7,374,984 B2 | 5/2008 | Hoffman et al. | |
| 7,377,616 B2 | 5/2008 | Sakurai | |
| 7,404,862 B2 | 7/2008 | Shtein et al. | |
| 7,406,761 B2 | 8/2008 | Jafri et al. | |
| 7,410,240 B2 | 8/2008 | Kadomatsu et al. | |
| 7,431,435 B2 | 10/2008 | Lopez et al. | |
| 7,431,968 B1 | 10/2008 | Shtein et al. | |
| 7,530,778 B2 | 5/2009 | Yassour et al. | |
| 7,603,028 B2 | 10/2009 | Yassour et al. | |
| 7,604,439 B2 | 10/2009 | Yassour et al. | |
| 7,648,230 B2 | 1/2010 | Kachi | |
| 7,677,690 B2 | 3/2010 | Takatsuka | |
| 7,802,537 B2 | 9/2010 | Kang et al. | |
| 7,857,121 B2 | 12/2010 | Yassour | |
| 7,883,832 B2 | 2/2011 | Colburn et al. | |
| 7,908,885 B2 | 3/2011 | Devitt | |
| 8,128,753 B2 | 3/2012 | Bulovic et al. | |
| 8,383,202 B2 | 2/2013 | Somekh et al. | |
| 2001/0045973 A1 | 11/2001 | Sharma et al. | |
| 2002/0008732 A1 | 1/2002 | Moon et al. | |
| 2002/0191063 A1 | 12/2002 | Gelbart et al. | |
| 2003/0000476 A1 | 1/2003 | Matsunaga et al. | |
| 2003/0175414 A1 | 9/2003 | Hayashi | |
| 2003/0230980 A1 | 12/2003 | Forrest et al. | |
| 2004/0009304 A1 | 1/2004 | Pichler | |
| 2004/0048000 A1 | 3/2004 | Shtein et al. | |
| 2004/0048183 A1 | 3/2004 | Teshima | |
| 2004/0056244 A1 | 3/2004 | Marcus et al. | |
| 2004/0086631 A1 | 5/2004 | Han | |
| 2004/0174116 A1 | 9/2004 | Lu et al. | |
| 2004/0202794 A1 | 10/2004 | Yoshida | |
| 2005/0005850 A1 | 1/2005 | Yamazaki et al. | |
| 2005/0190220 A1 | 9/2005 | Lim et al. | |
| 2005/0223994 A1 | 10/2005 | Blomlelly et al. | |
| 2006/0012290 A1 | 1/2006 | Kang | |
| 2006/0115585 A1 | 6/2006 | Bulovic et al. | |
| 2006/0159842 A1 | 7/2006 | Gupta et al. | |
| 2006/0203078 A1 | 9/2006 | Naugler et al. | |
| 2007/0040877 A1 | 2/2007 | Kachi | |
| 2007/0058010 A1 | 3/2007 | Nagashima | |
| 2007/0134512 A1 | 6/2007 | Klubek et al. | |
| 2007/0286944 A1 | 12/2007 | Yokoyama et al. | |
| 2008/0098891 A1 | 5/2008 | Feher et al. | |
| 2008/0174235 A1 | 7/2008 | Kim et al. | |
| 2008/0238310 A1 | 10/2008 | Forrest et al. | |
| 2008/0299311 A1 | 12/2008 | Shtein et al. | |
| 2008/0308037 A1 | 12/2008 | Bulovic et al. | |
| 2008/0309731 A1 | 12/2008 | Saito et al. | |
| 2008/0311289 A1 | 12/2008 | Bulovic et al. | |
| 2008/0311296 A1 | 12/2008 | Shtein et al. | |
| 2008/0311307 A1 | 12/2008 | Bulovic et al. | |
| 2009/0031579 A1 | 2/2009 | Piatt et al. | |
| 2009/0045739 A1 | 2/2009 | Kho et al. | |
| 2009/0115706 A1 | 5/2009 | Hwang et al. | |
| 2009/0167162 A1 | 7/2009 | Lin et al. | |
| 2009/0220680 A1 | 9/2009 | Winters | |
| 2010/0055810 A1 | 3/2010 | Sung et al. | |
| 2010/0079513 A1 | 4/2010 | Taira et al. | |
| 2010/0171780 A1 | 7/2010 | Madigan et al. | |
| 2010/0188457 A1 | 7/2010 | Madigan et al. | |
| 2010/0201749 A1 | 8/2010 | Somekh et al. | |
| 2010/0310424 A1 | 12/2010 | Rose et al. | |
| 2011/0008541 A1 | 1/2011 | Madigan et al. | |
| 2011/0057171 A1 | 3/2011 | Adamovich et al. | |
| 2011/0181644 A1 | 7/2011 | Bulovic et al. | |
| 2011/0267390 A1 | 11/2011 | Bulovic et al. | |
| 2011/0293818 A1 | 12/2011 | Madigan et al. | |
| 2012/0038705 A1 | 2/2012 | Madigan et al. | |
| 2012/0076925 A1 | 3/2012 | Bulovic et al. | |

FOREIGN PATENT DOCUMENTS

| | | |
|---|---|---|
| JP | 08-216401 | 8/1996 |
| JP | 09-248918 | 9/1997 |
| JP | 11-320873 A | 11/1999 |
| JP | 2002-069650 | 3/2002 |
| JP | 2005-286069 | 10/2005 |
| JP | 2005-288705 A | 10/2005 |
| JP | 2006-123551 | 5/2006 |
| JP | 2006-150900 | 6/2006 |
| JP | 2007-076168 | 3/2007 |
| JP | 2007-095343 | 4/2007 |
| JP | 2007-299616 | 11/2007 |
| JP | 2008-000977 A | 1/2008 |
| JP | 2008-221857 A | 9/2008 |
| JP | 05-255630 | 10/2009 |
| JP | 2010-143116 A | 7/2010 |
| KR | 100232852 | 12/1999 |
| KR | 10-2005-0072523 A | 7/2005 |
| KR | 10-2008-0060111 | 7/2007 |
| WO | WO 2005/090085 | 9/2005 |

OTHER PUBLICATIONS

Chen et al., "Ambient Environment Patterning of Organic Thin Films by a Second Generation Molecular Jet (MoJet) Printer," *Progress Report 2006-2007*, Oct. 2007, pp. 26-6; 26-7.

Chin, Byung Doo, "Effective Hole Transport Layer Structure for Top Emitting Devices Based on Laser Transfer Patterning," *Journal of Physics D: Applied Physics*, 2007, vol. 40, pp. 5541-5546.

(56) References Cited

OTHER PUBLICATIONS

Elwenspoek et al., "Silicon Micromachining," Aug. 2004, Cambridge University, Cambridge, U.K. ISBN 0521607671. [Abstract].
C. Ducso, et al. "Porous Silicon Bulk Micromachining for Thermally Isolated Membrane Formation," *Sensors and Actuators A,* 1997, vol. 60 pp. 235-239.
C. Tsamis, et al. "Thermal Properties of Suspended Porous Micro-hotplates for Sensor Applications," *Sensor and Actuators B*, 2003, vol. 95, pp. 78-82.
J. Lee, et al. "Differential Scanning Calorimeter Based on Suspended Membrane Single Crystal Silicon Microhotplate," *Journal of Microelectromechanical Systems*, Dec. 2008, vol. 17, No. 6, pp. 1513-1525.
J. C. Belmonte, et al. "High-temperature Low-power Performing Micromachined Suspended Micro-hotplate for Gas Sensing Applications<" *Sensors and Actuators B*, 2006, vol. 114, pp. 826-835.
G.S. Chung, "Fabrication and Characterization of Micro-heaters with Low-power Consumption using SOI membrane and Trench Structures," *Sensors and Actuators A*, 2004, vol. 112, pp. 55-60.
Geffroy et al., "Organic Light-emitting Diode (OLED) Technology: Material Devices and Display Technologies," *Polymer International*, Jun. 2006, vol. 55, pp. 572-582. (Abstract only).
Huang et al., "Reducing Blueshift of Viewing Angle for Top-Eimtting Organic Light-Emitting Devices," Dec. 6, 2008, 3 pages.
J. Lee, et al. "Cavity Effects on Light Extraction in Organic Light emitting Devices," *Applied Physics Letters*, Jan. 24, 2008, vol. 92, No. 3, 5 pages.
S.H. Kim et al. "Fabrication and Characterization of co-planar type MEMS Structures on SiO2/Si3N4 Membrane for Gas Sensors with Dispensing Method Guided by Micromachined Wells," Journal of Eletroceramics, Jun. 27, 2005, vol. 17, No. 2-4, pp. 995-998.
Street et al., "Jet Printing of Active-Matrix TFT Backplanes for Displays and Sensors", *IS&T Archiving*, Dec. 2005, vol. 20, No. 5, 16 pages.
Forrest, Stephen R., "The Path to Ubiquitous and Low-cost Organic Electronic Appliances on Plastic," *Nature*, Apr. 29, 2004, vol. 428, 8 pages.
Leblanc et al., "Micromachined Printheads for the Evaporative Patterning of Organic Materials and Metals," *Journal of Microelectromechanical Systems*, Apr. 2007, vol. 16, No. 2, 7 pp. 1-139.
Lindermann et al., "Thermal Bubble Jet Printhead with Integrated Nozzle Plate," *NIP20: International Conference on Digital Printing Technologies*, Oct. 2004, pp. 834-839.
Chen, Jianglong, "Novel Patterning Techniques for Manufacturing Organic and Nanostructured Electronics," *M.S. Materials Science and Engineering*, Massachusetts Institute of Technology, 2003, pp. 1-206.
Chen, Jingkuang et al., "A High-Resolution Silicon Monolithic Nozzle Array for Inkjet Printing," *IEEE Transactions on Electron Devices*, vol. 44, No. 9, Sep. 1997, pp. 1401-1409.
International Search Report issued on Dec. 15, 2010 for PCT Application No. PCT/US10/020144.
International Search Report issued on Sep. 2, 2010 for PCT Application No. PCT/US10/033315.
International Search Report and Written Opinion issued on Mar. 24, 2011 for PCT Application No. PCT/US10/058145.
International Preliminary Report on Patentability issued on Dec. 17, 2009 for PCT Application No. PCT/US08/66975.
International Preliminary Report on Patentability issued on Dec. 7, 2009 for PCT Application No. PCT/US08/066991.
International Preliminary Report on Patentability issued on Dec. 17, 2009 for PCT Application No. PCT/US08/67002.
US Non-Final Office Action issued for U.S. Appl. No. 11/282,472 on Sep. 16, 2009.
US Final Office Action issued for U.S. Appl. No. 11/282,472 on Jan. 6, 2010.
US Non-Final Office Action issued for U.S. Appl. No. 11/282,472 on Nov. 18, 2010.
EP Examination Report dated Jul. 30, 2010 issued for EP Patent Application 08771068.7.
CN Office Action dated Oct. 12, 2010 issued for CN Patent Application 200880020197.8.
EP Examination Report dated Jul. 13, 2010 issued for EP Patent Application 08771094.3.
CN Office Action dated Dec. 17, 2010 issued for CN Patent Application 200880020151.6.
CN Office Action dated Jan. 12, 2011 issued for CN Patent Application 200880019990.6.
EP Examination Report dated Jul. 13, 2010 issued for EP Patent Application 08771084.4.
Notice of Allowance issued on Aug. 20, 2013 to U.S. Appl. No. 13/327,745.
International Search Report and Written Opinion issued on Sep. 25, 2012 for PCT Application No. PCT/US12/023862.
International Search Report and Written Opinion issued on Sep. 3, 2012 for PCT Application No. PCT/US11/065306.

\* cited by examiner

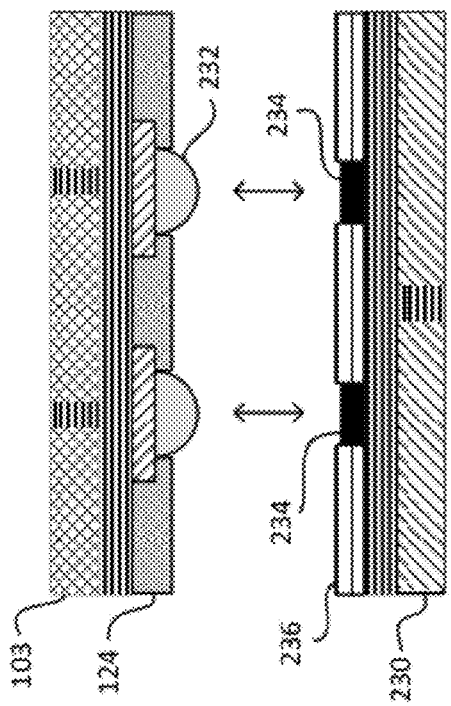
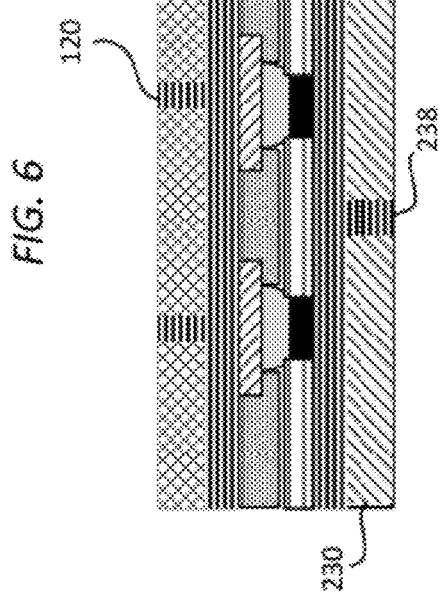
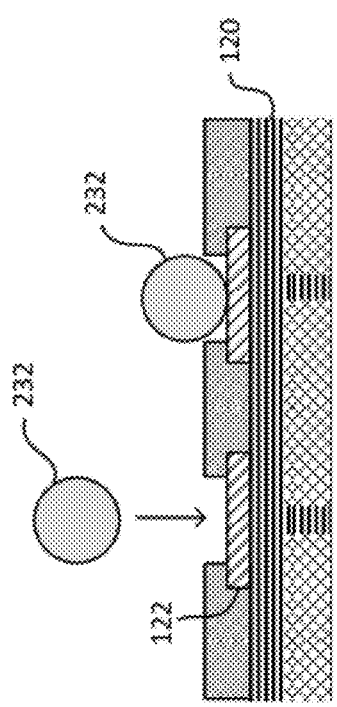
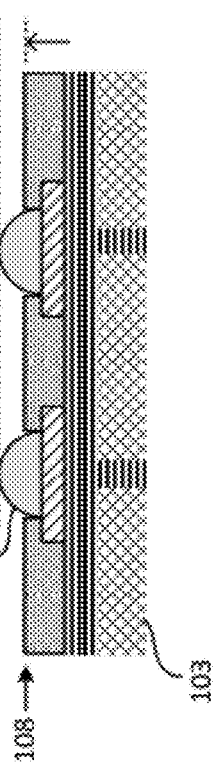
FIG. 4
FIG. 5
FIG. 6
FIG. 7

LOW-PROFILE MEMS THERMAL PRINTHEAD DIE HAVING BACKSIDE ELECTRICAL CONNECTIONS

The instant application claims priority to the Provisional Application No. 61/439,816, filed Feb. 4, 2011, the disclosure of which is incorporated herein in its entirety.

BACKGROUND

1. Field of the Invention

The present disclosure relates generally to printheads for evaporative printing of organic materials. More specifically, the disclosure relates to a MEMS printhead fabricated from an SOI material and assembled using backside solder connections for layering organic thin film onto a substrate by sublimation of ink.

2. Description of the Related Art

Organic optoelectronic devices, such as organic light emitting diodes (OLEDs) used for flat-panel displays, are fabricated by depositing layers of organic film onto a target substrate and coupling the top and bottom of the film stack to electrodes. Using advanced techniques, film layer thicknesses on the order of 100 nanometers can be achieved.

One such technique deposits OLED film layers onto substrate by thermal evaporation of the organic material from a thermal printhead. The organic ink material is first dissolved in a liquid carrier to form a liquid ink. The ink is transferred to the printhead, and the target substrate and printhead are drawn into close proximity. The ink is then heated in stages. The first stage evaporates the solvent. During the second stage, the ink is heated rapidly above its sublimation temperature until the organic ink materials evaporate to cause condensation of the organic vapor onto the target substrate. The process may be repeated until a desired film layer thickness is achieved. The composition of ink may be varied to achieve different colors and to optimize other properties such as viscosity and sublimation temperature.

High resolution OLED displays may require pixel characteristic dimensions on the order of 100 microns or less. To achieve this degree of quality control, the printhead gap, that is, the gap between the printhead and the target substrate should be specified on an order of magnitude commensurate with the desired pixel characteristic dimensions. MEMS technology has been proposed for fabricating thermal printheads for evaporative deposition having this level of precision. One of the problems to be solved with this approach, and which is addressed by the present disclosure, is how to deliver electrical energy to the printing surface of a MEMS thermal printhead while enabling a sufficiently small print gap.

SUMMARY

The present disclosure provides a thermal, non-contact printhead die that can be positioned to within 10-100 microns of a substrate receiving ink from the printhead. The reduced print gap enables layers of organic LED compounds to be printed onto the substrate for superior film morphology, uniformity, and feature resolution.

In one embodiment, a thermal printhead die according to the disclosure is formed on an SOI structure having a printing surface, a buried oxide layer, and a mounting surface opposite the printing surface. A plurality of ink delivery sites are formed on the printing surface, each site having an ink-receiving and ink-dispensing structure, and an ohmic heater formed adjacent to the ink-receiving and ink-dispensing structure. At least one under-bump metallization ("UBM") pad is formed on the mounting surface and electrically connected to the ohmic heater. Ink received by the ink-delivery site and heated by the ohmic heater may then be delivered to a substrate by sublimation.

The ohmic heater may be electrically coupled to the UBM pad through the buried oxide layer by means of a through-silicon via ("TSV") plug. The TSV plug may be formed by a doping process. An interconnect metal, such as a titanium-tungsten-aluminum layer, may be formed to couple the TSV plug to the UBM pad and to the ohmic heater. Each ink delivery site may include an electrical conduction cavity formed through the printing surface, so that the interconnect metal connects the ohmic heater to the TSV plug along a sidewall of the conduction cavity and through an opening in the buried oxide layer.

A method according to the disclosure prescribes steps for manufacturing a MEMS thermal printhead die on an SOI structure having a top surface, a buried oxide layer, and a mounting surface opposite the top surface. In one embodiment, the method provides steps for: (a) forming a plurality of ink-dispensing pores on the top surface of the SOI structure, each pore comprising a recessed area, (b) forming an ohmic heater adjacent to at least one of the ink-dispensing pores, (c) forming at least one UBM pad on the mounting surface, and (d) forming at least one TSV plug through the buried oxide layer, the TSV plug electrically coupling the ohmic heater to the UBM pad through the buried oxide layer. The method may further include: forming through the mounting surface a plurality of ink-receiving cavities, each ink-receiving cavity corresponding to a plurality of the ink-dispensing pores, that allow flow of ink between each ink-receiving cavity and the printing surface, or forming a conduction cavity through the printing surface so that one or more layers of interconnect metal may connect the ohmic heater to the TSV plug along a sidewall of the conduction cavity.

Another embodiment of a method according to the disclosure enables manufacturing of a MEMS thermal printing system. The manufacturing steps include: (a) forming a plurality of ink-dispensing pores on a top surface of an SOI structure, (b) forming a plurality of ohmic heaters, each ohmic heater adjacent to a corresponding plurality of ink-dispensing pores and an ink-receiving cavity, (c) forming one or more UBM pads on the mounting surface, (d) forming a plurality of TSV plugs through a buried oxide layer of the SOI structure, each TSV plug electrically coupling one of the ohmic heaters to the one or more UBM pads, (e) dispensing a solder ball onto each of the UBM pads, (f) reflowing the solder balls, (g) contacting the reflowed solder balls to complementary pads on the mounting substrate, and (h) curing the solder balls so that the cured solder provides mechanical connection between the printhead die and the mounting substrate, and electrical connection from each complementary pad to one of the ohmic heaters through the mounting surface of the SOI structure.

BRIEF DESCRIPTION OF THE DRAWINGS

Other systems, methods, features and advantages of the disclosure will be or will become apparent to one with skill in the art upon examination of the following figures and detailed description. It is intended that all such additional systems, methods, features and advantages be included within this description, be within the scope of the disclosure, and be protected by the accompanying claims. Component parts shown in the drawings are not necessarily to scale, and may be exaggerated to better illustrate the important features of the disclosure. In the drawings, like reference numerals may designate like parts throughout the different views, wherein:

FIG. 4 is a magnified cross-sectional view of a thermal printhead die illustrating a fabrication step in which solder balls are placed onto the backside of UBM pads;

FIG. 5 is a magnified cross-sectional view of a thermal printhead die illustrating a fabrication step after jetting, in which the solder balls are reflowed on the UBM pads;

FIG. 6 is a magnified cross-sectional view of a thermal printhead die illustrating another fabrication step in which the printhead die is flipped and aligned with a mounting substrate;

FIG. 7 is a magnified cross-sectional view of a thermal printhead die illustrating another fabrication step in which the die is brought into contact with the mounting substrate and the solder is reflowed a second time;

DETAILED DESCRIPTION

The art of thermal non-contact printing is advanced according to the disclosure by fabricating a printhead die as a MEMS device on an SOI structure using techniques disclosed herein. These techniques may achieve a print gap of 100 microns or less between the printhead and the targeted substrate. This achievement enables the printhead to deposit layers of organic LED compounds onto the substrate for superior film morphology, uniformity, and feature resolution.

Figure 1:
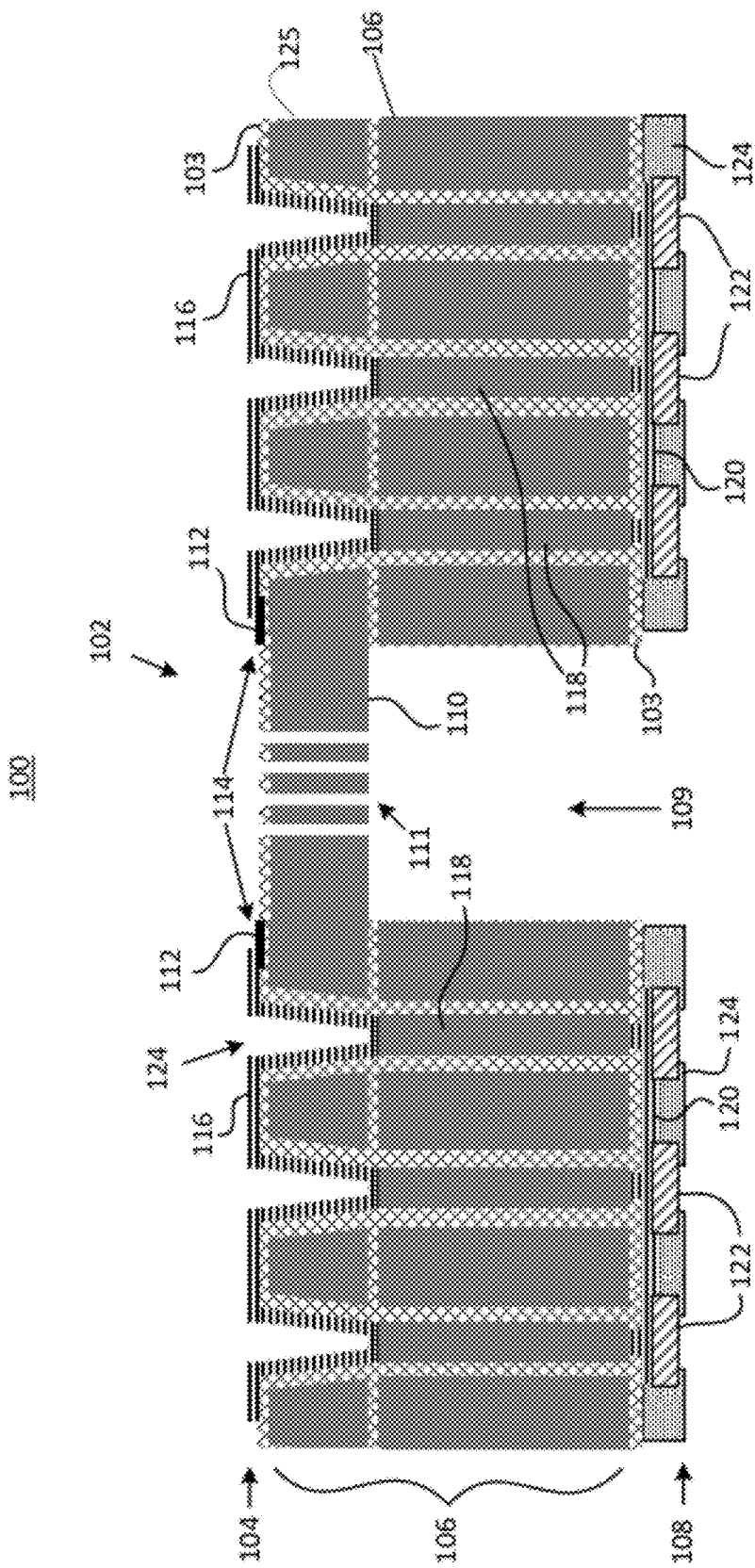
FIG. 1 is a cross-sectional view of a portion of a thermal printhead die including an ink-delivery site according to one embodiment of the disclosure.

FIG. 1 shows a cross-sectional view of one embodiment of a thermal printhead die 100 that is designed in accordance with principles of the present disclosure. This view illustrates an ink-delivery site 102 that is located in the central portion of the diagram. In terms of its general dimensional scale, the printhead die 100 has a total height on the order of about 400 microns, which is determined by the thickness of a typical SOI substrate from which the die 100 may be fabricated. The single ink-delivery site 102 is shown for purposes of illustration. A complete printhead die according to the disclosure will typically include many hundreds or thousands of such sites, fabricated on a single SOI substrate and arranged in a two-dimensional array. Thus, it must be understood that the pattern shown in FIG. 1 may recur many times throughout the array.

As stated above, in one embodiment the thermal printhead die 100 may be fabricated using an SOI substrate. A conventional SOI substrate will typically include three layers of material: an upper layer of device-quality silicon, a middle oxide insulating layer (a.k.a. buried oxide layer), and a lower silicon layer (interchangeably, handle layer). The structure of the thermal printhead die 100, as shown, may be fabricated within an SOI substrate by selectively polishing or etching away areas within one or more of these layers and building up the components of the die structure using various deposition techniques. Generally, the printhead die 100 provides a mechanical structure for delivering ink from a printing surface of the die to a target substrate, for providing a mounting surface for attaching the die to its parent printing system, and for providing insulated electrical conduction paths for delivering thermal energy from the printing system to the printing surface. An SOI substrate may facilitate fabrication of printhead die 100, however, the disclosure is not limited solely to fabrication on an SOI substrate, as other types of semiconductor wafers or substrates may be used as a foundation for the die. Any such substrate capable of modification to achieve the structures disclosed herein may be used for fabrication.

Printhead die 100 may be fabricated from an SOI substrate through a series of forming steps, resulting in the structure shown. Generally, the electrically conductive components of printhead die 100, which are described below in further detail, may be formed within the SOI structure by means of a doping technique, or by etching away selected portions of the buried oxide layer and refilling the void with conductive or dielectric material, for example, by means of a chemical deposition or ion implantation technique. In the cross-sectional diagram, visible portions of the oxide layer that provides electrical isolation are indicated throughout the structure by the diagonally cross-hatched pattern 103.

In a final form, printhead die 100 may include a printing surface 104, a buried oxide layer 106, and a mounting surface 108 opposite the printing surface 104. As noted above, selected areas of the SOI structure may be refilled or doped to create conductive layers (e.g. 118) where needed. A plurality of ink delivery sites 102 may be formed on the printing surface 104. Each ink delivery site 102 may further include an ink-receiving and ink-dispensing structure 110, and an ohmic heater 112. The ohmic heater 112 may be formed adjacent to the ink-receiving and ink-dispensing structure.

In another embodiment, the ink-receiving and ink-dispensing structure 110 may further include an ink-receiving cavity 109 and one or more pore 111 formed in the SOI structure. Pores 111 provide a fluid communication path between the ink-receiving cavity 109 and printing surface 104. In one implementation, pores 111 may be oriented substantially normal to printing surface 104. The structure 110 is designed so that ink received into the ink-receiving cavity 109 can migrate through the pores 111 by capillary action to the print surface 104 to be heated by heaters 112.

Ohmic heaters 112 may be formed preferably by means of a deposition technique using a material having good heat transfer and electrical conducting properties. In one embodiment, heaters 112 may be formed from titanium-platinum-titanium (Ti—Pt—Ti) material. At least one heater 112 should be placed adjacent to each plurality of pores 111 on the printing surface 104. Electrical current is delivered to the ohmic heaters by one or more conductive paths formed between the mounting surface 108 and the printing surface 104.

In one embodiment, a conductive path from the printing surface 104 to the mounting surface 108 may include a heater 112, an interconnect layer 116, a through-silicon via (TSV) plug 118, a second interconnect layer 120, and a UBM pad 122. Interconnect layers 116 and 120 may be formed, for example, by sputtering titanium-aluminum (Ti—Al), titanium-tungsten-aluminum (Ti—W—Al), titanium-tungsten-gold (Ti—W—Au), or from some other alloy suitable for deposition as an interconnecting conductor to electrically couple the heater 112 to the TSV plug. TSV plug 118 may be formed through the printhead die using a conventional technique. The via may be made more conductive by selective doping or by electrical isolation of a region within a highly-doped silicon handle layer. The second interconnect layer 120 electrically couples the bottom portion of the TSV plug 118 to the UBM pad 122, and may be formed from the same or similar material, and by the same or similar etching and deposition technique, as used to form the first interconnect layer 116.

In one embodiment, an electrical conduction cavity 125 may be formed above the TSV plug 118 and beneath the printing surface 104. The conduction cavity 125 may define sloped sidewalls leading to the top of the TSV plug, as shown. In one embodiment, the conduction cavity 125 may be formed by etching through the buried oxide 106 near the printing surface 104, and the interconnect layer 116 may be formed along the bottom of the conduction cavity to electrically couple the ohmic heater 112 to the TSV plug 118.

At the mounting surface 108, UBM pads 122 are formed beneath the second interconnect layer 120 to provide a material onto which solder can wet to make a reliable mechanical and electrical connection. In one embodiment, this may be achieved by forming the UBM pads 122 from a complex layer of evaporated or electroplated metals, such as a titanium-nickel-gold (Ti—Ni—Au) layer. Ti—Ni—Au layers are commonly used as corrosion-resistant contacts in CMOS flip-chip applications, and are typically formed using an electroplating process. In a MEMS device of the present disclosure, however, an electroplating bath could contaminate the delicate pore structure 110 and inhibit the delivery of ink to the printing surface. Therefore, an evaporative layering technique may be preferred for forming the Ti—Ni—Au layer. For example, depositing layers of the UBM pad by evaporating first titanium, followed by nickel (Ni), and then gold (Au) as the outermost layer. Other metals, such as platinum or palladium, may also compose the UBM pad without departing from the scope of the disclosure.

Figure 2:
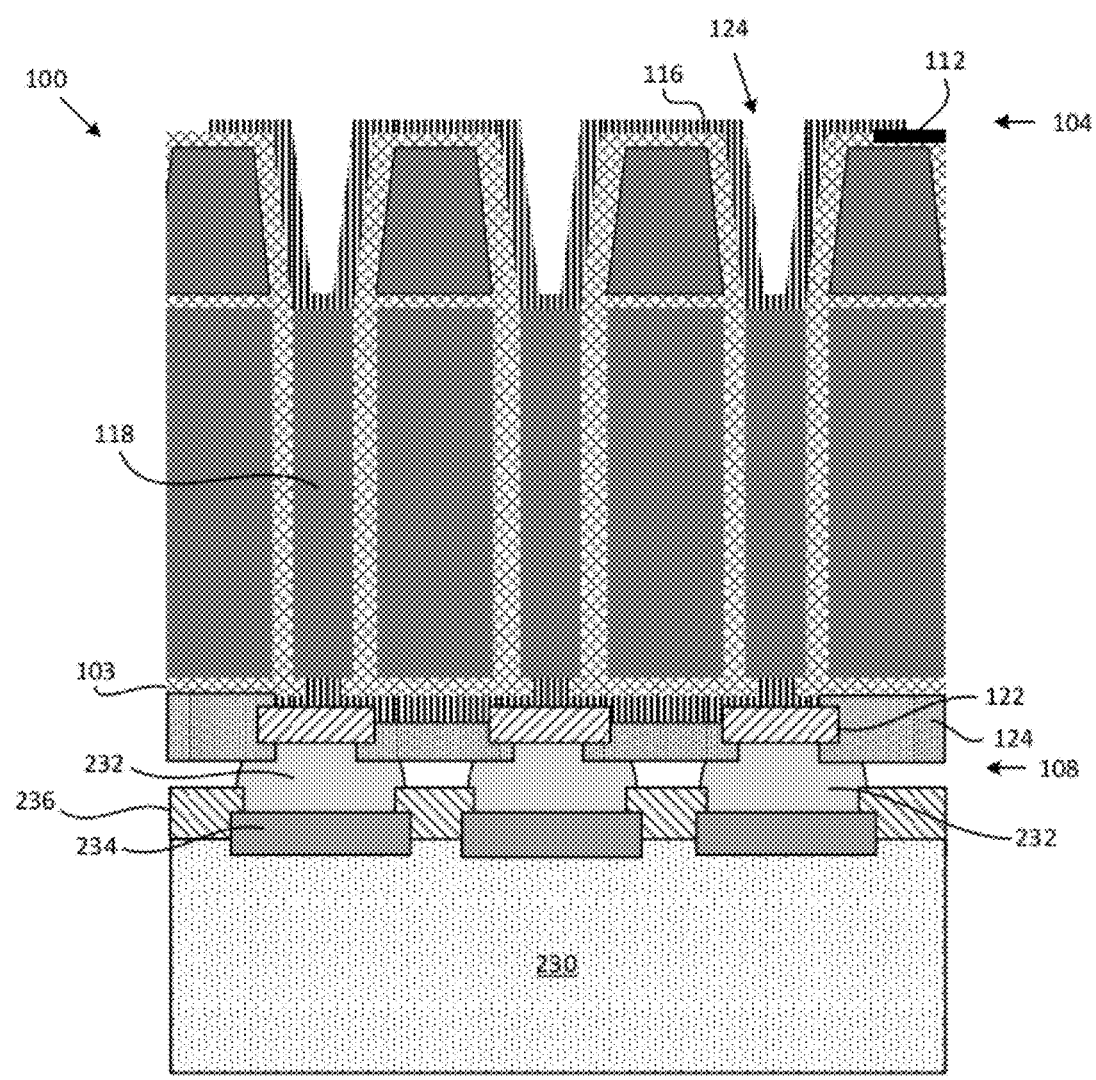
FIG. 2 is a magnified cross-sectional view of the thermal printhead die of FIG. 1 showing backside electrical connections, according to another embodiment of the disclosure.

After depositing or evaporating the UBM pads 122 onto the mounting surface 108, a dielectric layer 124 may be disposed along the mounting surface to form a soldering cavity around each UBM pad. In one embodiment, the dielectric layer 124 may be formed by means of a plasma enhanced chemical vapor deposition (PECVD) technique. In one embodiment, the dielectric layer 124 forms an oxide and nitride cap that, at each UBM site, exposes at least a portion of the UBM pad for connection to an external electrical source. In one embodiment, the dielectric cap forms a solder reflow dam on the UBM pad to limit the flow of solder in the vicinity of the UBM pad. According to the disclosure, dimensional control of the solder reflow dam and control of the volume of solder applied to the UBM pad allows for more precise control of the location of the contact plane formed by a plurality of solder balls extending below the mounting surface 108, as shown in FIG. 2.

Figure 3:
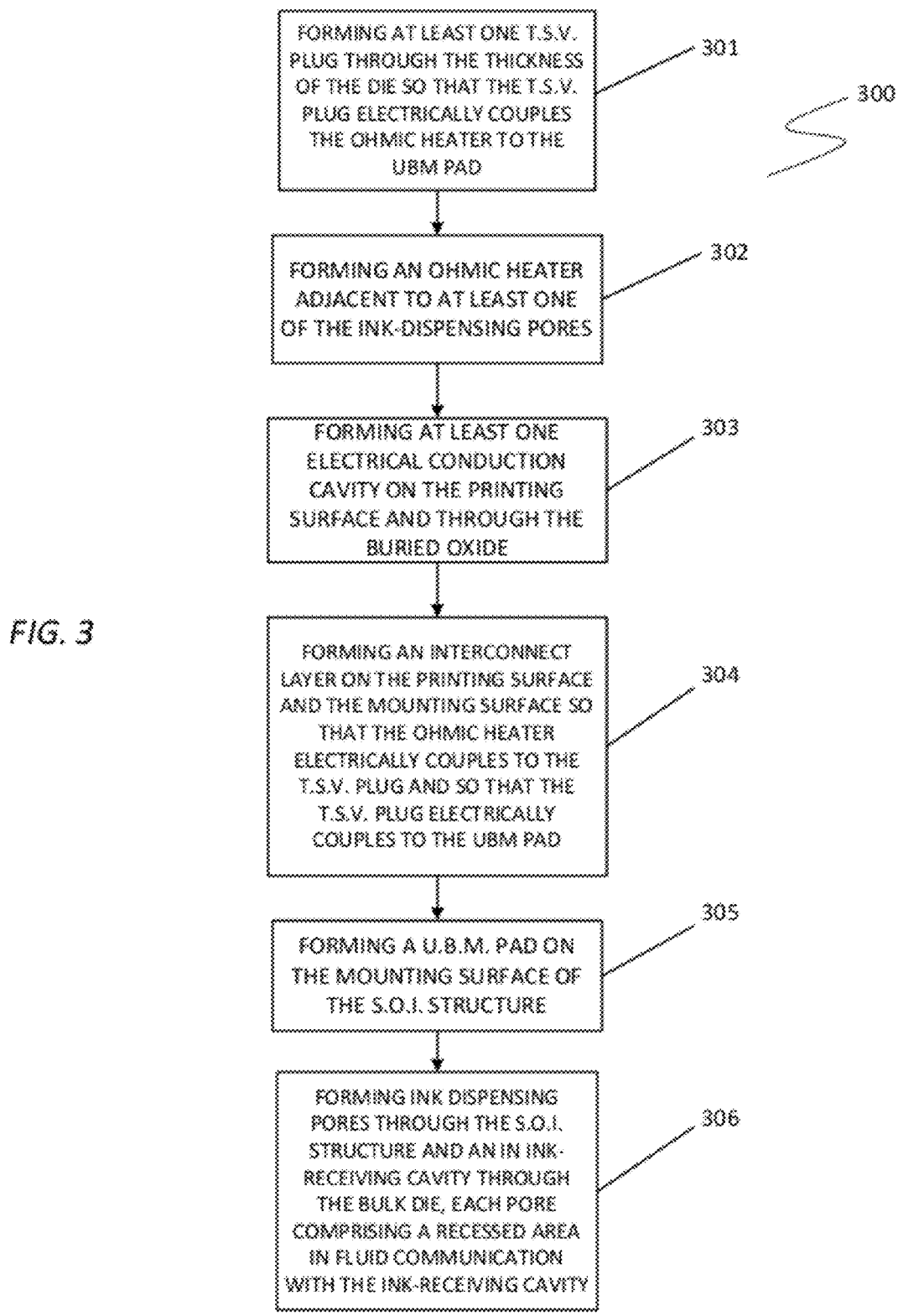
FIG. 3 is a process flow diagram illustrating one embodiment of a method according to the disclosure for manufacturing a MEMS thermal printhead die.

The foregoing description of the structure of the MEMS printhead die and methods for effecting its fabrication may be summarized as a series of steps in a process according to the disclosure. These steps are represented in the process flow chart of FIG. 3. The process described therein may be used to fabricate the printhead die from an SOI structure having a top surface, a buried oxide layer, and a mounting surface opposite the top surface.

Method 300 begins at step 301, by forming at least one TSV plug through the thickness of the die so that the TSV plug electronically couples the ohmic heater to the UBM pad. In step 302, an ohmic heater is formed adjacent to at least one of the ink-dispensing pores. In step 303, an electrical conduction cavity is formed on the printing surface and through the buried oxide layer. In step 304, an interconnect layer is formed on the printing surface and the mounting surface so that the ohmic heater electrically couples to the TSV plug. The TSV plug also couples to the UBM pad. In step 305, a UBM pad is formed on the mounting surface of the SOI structure. Finally, in step 306, ink dispensing pores are formed through the SOI structure and an ink-receiving cavity is formed through the bulk die. Each pore comprises a recessed area in fluid communication with the ink-receiving cavity.

It should be appreciated that the processes described in the foregoing paragraphs may be applied to achieve the general structural pattern of thermal printhead die 100 so that multiple parallel conduction paths may be formed through the structure between multiple UBM pads 122 on the mounting surface 108 and the heater or heaters 112 on the printing surface 104. In operation, with a supply of ink loaded into the ink-receiving cavity 109, the printhead die may be electrically energized by a potential applied to UBM pads 122, which causes the heaters 112 to generate heat through $I^2R$ losses and transfer the heat to ink drawn into the ink-dispensing pores 111. The ink solvents evaporate at the solvent evaporation temperature and organic material remains in pores 111. In one embodiment (not shown), as the organic material heats up beyond its sublimation temperature, the remaining organic materials sublimate and travel to a target substrate (not shown) that may be placed in close proximity to printing surface 104. Condensation of the organic vapor onto the target substrate prints a layer of the organic material thereon. It should be further appreciated that the structure of printhead die 100 can achieve a minimal print gap by eliminating external conductors from the printing surface for powering the heaters. The disclosure, by providing conduction paths to the heaters through the SOI structure, obviates the need for external conductors that would otherwise obstruct and add to the printhead gap.

With reference again to FIG. 2, there is shown a magnified cross-sectional view of the thermal printhead die of FIG. 1. This view includes detail for backside electrical connections on the mounting surface 108 that mechanically and electrically attach the printhead die to a mounting substrate 230. The substrate 230 may be a conventional ceramic type substrate such as those used in printed circuit boards. The connections are made using a dual-reflow soldering process according to the disclosure, in which the solder balls are reflowed a first time to bond the solder to the UBM pads 122, and then reflowed a second time to bond the solder to complementary pads 234 on the mounting substrate 230.

FIGS. 4, 5, 6 and 7 further illustrate the dual-reflow process. Each of these figures shows a magnified cross-sectional view and a portion of the mounting surface 108 during a sequential step in the dual-reflow process. In the first step shown in FIG. 4, the solder balls 232 are dispensed onto the UBM pads 122 of the thermal printhead die 100. A jetting technique may be used to control dispensation of the solder, so that a substantially equal volume of solder is received on each of the UBM pads.

In the next step depicted in FIG. 5, the solder balls are heated to above their melting temperature and caused to reflow onto the UBM pads. As the reflowed solder balls wet to the UBM pads, the flow of the solder is restricted by the solder dam formed by dielectric 124 to an area immediately adjacent to the UBM pad. The structure of the UBM pad causes the solder balls, when cured, to form domes that each extend from the mounting surface 108 to a substantially uniform distance, d, as shown.

In the next step depicted in FIG. 6, the mounting surface 108 of the printhead die is brought into alignment with mounting substrate 230 so that the array of solder domes 232 aligns with a complementary array of pads 234. The printhead die 100 may be flipped, as shown, before performing this step. A solder mask or dielectric layer 236 may be provided to create solder reflow dams on the complementary pads 234 of the mounting substrate.

In the final step depicted in FIG. 7, the printhead die 100 is brought into contact with the mounting substrate so that each solder dome 232 contacts a pad 234. In this position, the second reflow step is initiated by melting the solder domes until they wet to the pads 232. The solder is then allowed to cool. When cured, the printhead dies 100 is mechanically and electrically connected to the substrate 230 by the soldered junctions 232, as shown in FIGS. 2 and 7. So configured, ohmic heaters on the printhead die may be energized by application of an electric potential to a trace 238 running through the mounting substrate 230.

Figure 8:
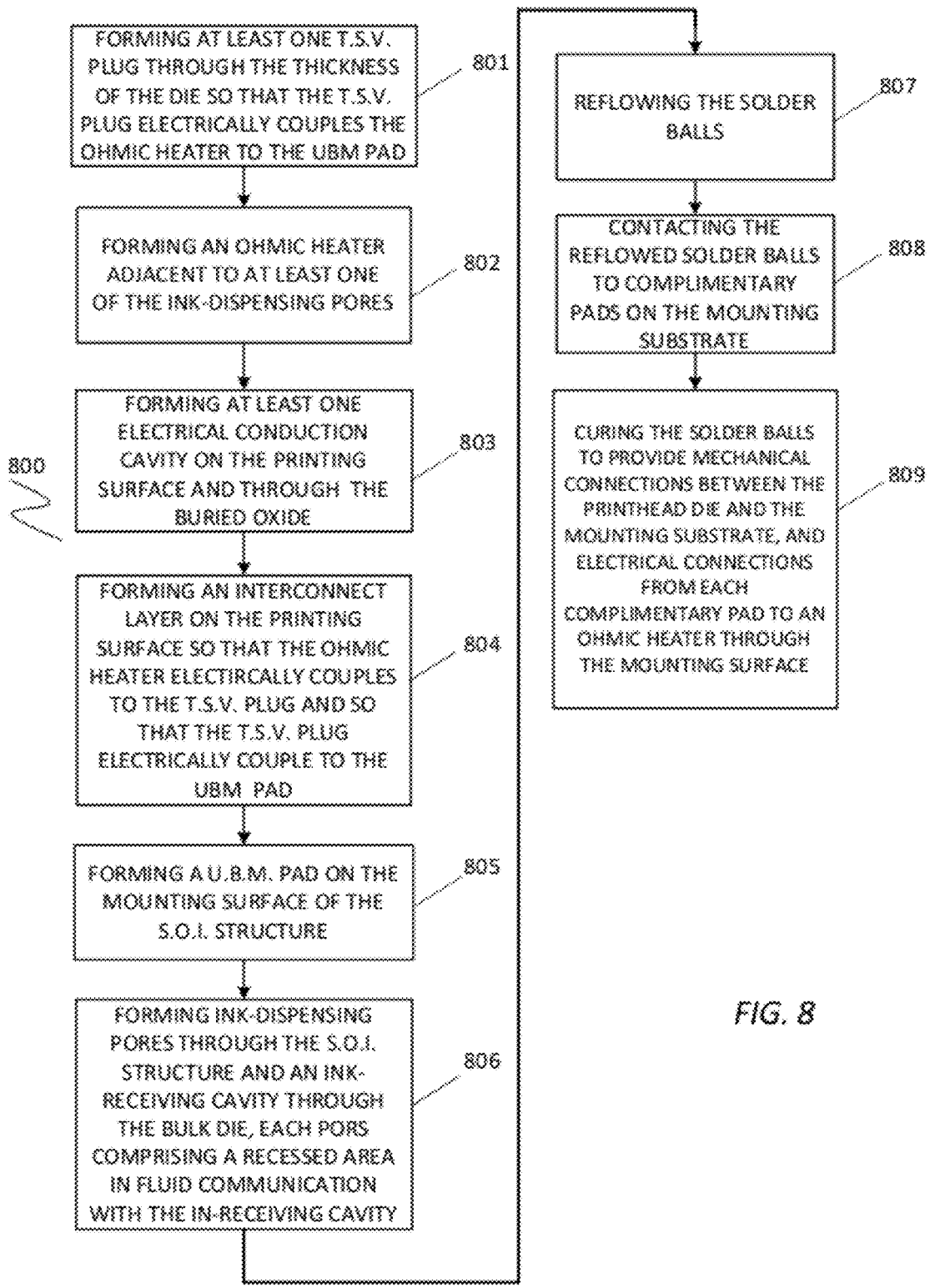
FIG. 8 is a process flow diagram illustrating another embodiment of a method for manufacturing a MEMS thermal printhead die.

The foregoing disclosure for fabricating a MEMS thermal printhead die and for effecting backside electrical connection of the printhead die to a mounting substrate may be summarized as a process or method 800 according to the disclosure. The following steps in the process represent salient steps as depicted in the block diagram of FIG. 8. It should be understood that the process may be supplemented by additional steps without departing from the scope of the disclosure.

The method 800 begins at step 801, by forming at least one TSV plug through the thickness of the die so that the TSV plug electrically couples the ohmic heater to UBM pad. In step 802, an ohmic heater is formed adjacent to at least one of the ink dispensing pores. In step 803, one or more electrically conductive cavity is formed on the printing surface and through the buried oxide layer. In step 804, an interconnect layer is formed on the printing surface and the mounting surface so as to couple the ohmic heater to the TSV plug and to couple the TSV plug to the UBM pad. In step 805, a UBM pad is formed on the mounting surface of the SOI structure. In step 806, ink-dispensing pores are formed through the SOI structure and an ink-receiving cavity is formed through the bulk die. In an embodiment of the disclosure, each pore comprises a recessed area in fluid communication with the ink receiving cavity. In step 807, the solder balls are heated to reflow. In step 808, the melted solder balls are moved to the complementary pads on the mounting substrate. In step 809, the solder balls are cured to provide mechanical connections between the printhead die and the mounting substrate. The solder balls also provide electrical connections from each complementary pad to an ohmic heater through the mounting surface.

The fabrication steps that are involved in attaching the thermal printhead die to the mounting substrate can have significant effect on the overall print gap. As the second reflow step nears completion, some deformation of the die may occur that affects the relative flatness, or horizontal offset, between the mounting surface of the printhead die and the mating surface of the mounting substrate. The deformation may occur during cooling, due to a mismatch in the coefficient of thermal expansion between the printhead die and the mounting substrate. The resulting horizontal offset will likely deviate from zero by a small degree. A skilled artisan will appreciate that any horizontal offset will contribute a corresponding vertical offset to the print gap, where the vertical offset is a function of the both the horizontal offset and a length of the top surface of the printhead die. Another aspect of the present disclosure addresses the problem of horizontal offset by providing a means for controlling, with high precision, the flatness of the thermal printhead die during the final curing steps.

Figure 9:
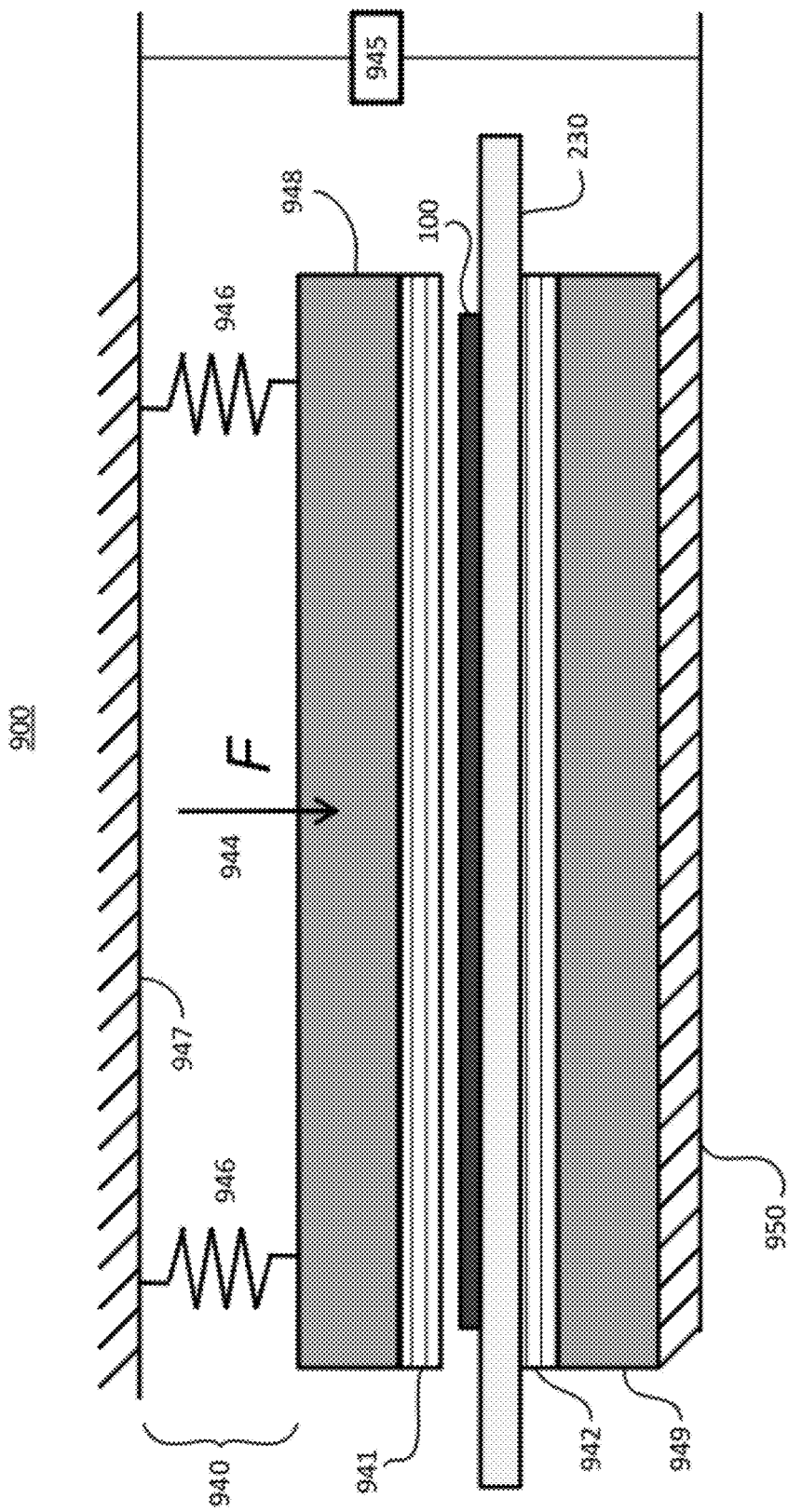
FIG. 9 is a schematic diagram illustrating an apparatus for precision attachment of a MEMS thermal printhead die to a mounting substrate according to the disclosure.

FIG. 9 illustrates in schematic form an apparatus 900 for precision attachment of a MEMS thermal printhead die to a mounting substrate according to the disclosure. The die-attach apparatus 900 includes a linear single-axis flexure stage 940, mating parallel plates 941 and 942, an actuator 944, and a sensor 945. Flexure stage 940 may include one or more flexure springs 946, each of which may attach at one end to a rigid frame 947. The parallel plates 941 and 942 provide high-precision horizontal planes for aligning the die 100 to the substrate 230. A shuttle 948 may attach the plate 941 to the linear flexure stage 940. A base plate 949 may attach the plate 942 to a fixed horizontal reference 950. In the schematic, actuator 944 is modeled as a force F acting in the vertical direction. This force may be imparted manually, by gravity, by an electric or hydraulic motor, etc.

The sensor 945 measures the position of the stage 940 as it moves with respect to the fixed reference 950. In one embodiment, sensor 945 may comprise a removable capacitive sensor. The sensor may be used in a feedback loop to the actuator 944 to control the applied load F.

The flexure 940 may be formed from metal such as stainless steel so that it may expand freely in the direction of force F when heat is applied to effect solder reflow. The flexure may be machined by wire EDM or by abrasive water-jet cutting. The parallel plates 941 and 942 may be fixed to the flexure stage 940 and base plate 949 using an epoxy bond cured under preload of the flexure.

The printhead die 100 and mounting substrate 230 may be positioned between the precision plates 941 and 942 and aligned for the second reflow step. A preload force may be applied to push the precision plates together, and thereby press the die against the mounting substrate so that solder balls wetted to the printhead die in a first reflow step mate to complementary pads on the mounting substrate along a contact plane. The dynamics of the flexure stage work to achieve pure vertical (Z-axis) motion and to distribute load evenly along the X-Y plane of contact, to ensure parallel orientation of the die with respect to the substrate, and to prevent deformation of the die from parasitic motion such as yawing, twisting, and X-axis and Y-axis parasitic motion. For example, the parallel offset of shuttle 948 and base plate 949 can be minimized to a desired value, such as to within about 2.0 microns, as a function of the applied load. Using an apparatus 900, the horizontal offset or bowing of the printhead die can be limited to about 10 microns or less.

While under preload from the flexure stage 940, the second solder reflow step may be performed to mechanically and electrically bond the printhead die to the mounting substrate. In one embodiment, the entire apparatus 900 may be enclosed within a solder reflow furnace during the second reflow step.

Figure 10:
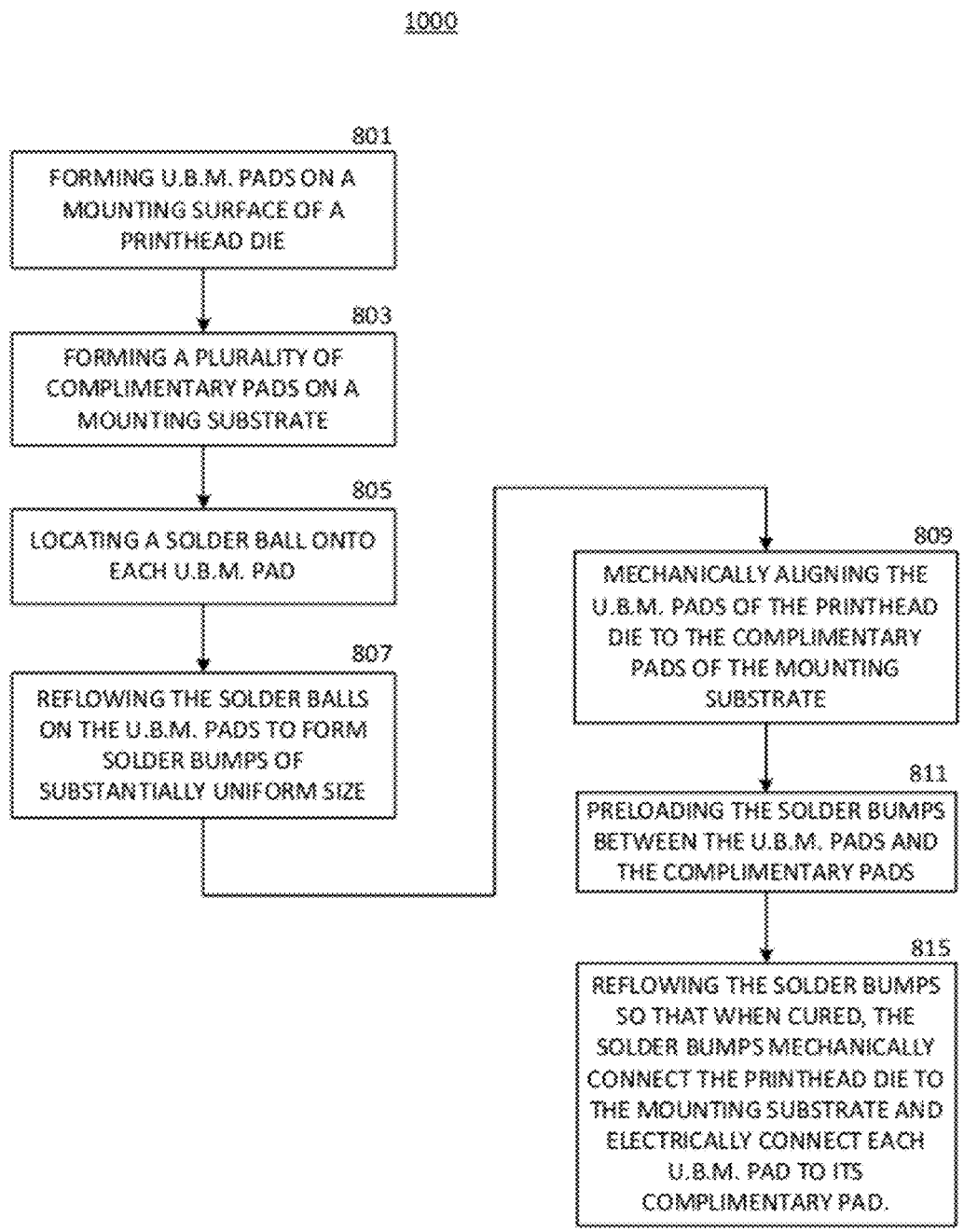
FIG. 10 is a process flow diagram illustrating another embodiment of a method according to the disclosure for manufacturing a MEMS thermal printhead die.

From the foregoing descriptions of the dual-reflow process and the flexure apparatus 900, salient steps of a method may be derived for attaching a MEMS printhead die to a mounting substrate. This method 1000 is illustrated in the flow diagram of FIG. 10.

Method 1000 begins at step 1001, in which a plurality of UBM pads are formed on a mounting surface of the printhead die. In the next step, 1003, a plurality of complementary pads are formed on the mounting substrate. The resulting pattern of complementary pads may be formed to match up geometrically with the UBM pads of the printhead die. In the next step 1005, a solder ball may be located or jetted onto each of the UBM pads.

The next step 1007 is the first solder reflow step. This step involves reflowing the solder balls on the UBM pads. Ideally, the resulting solder bumps achieve a substantially uniform size, so that each solder bump extends from the die by a substantially uniform distance. Next, in step 1009, the UBM pads of the printhead die are mechanically aligned to the complementary pads of the mounting substrate. Then in step 1011, a preload force may be applied between the printhead die and the mounting substrate to maintain the solder bumps in contact with the complementary pads during the second reflow step. In the second reflow step 1013, the solder bumps are reflowed so that they wet to the complementary pads. The solder bumps are then cooled and allowed to cure. The cured solder bumps mechanically connect the printhead die to the mounting substrate and electrically connect each of the UBM pads to its complementary pad.

Exemplary embodiments of the disclosure have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A thermal printhead die, comprising:
   an SOI structure having a printing surface, a buried oxide layer, and a mounting surface opposite the printing surface;
   a plurality of ink delivery sites, each site having an ink-receiving and ink-dispensing structure formed on the printing surface, and
   an ohmic heater formed adjacent to the ink-receiving and ink-dispensing structure; and
   at least one under-bump metallization ("UBM") pad formed on the mounting surface and electrically connected to the ohmic heater; and
   at least one through-silicon via ("TSV") plug electrically coupling the ohmic heater to the at least one UBM pad through the buried oxide layer.

2. The printhead die of claim 1, further comprising interconnect metal coupling the ohmic heater to the UBM pad.

3. The printhead die of claim 1, further comprising interconnect metal coupling the ohmic heater to the TSV plug.

4. The printhead die of claim 3, wherein each ink delivery site further comprises at least one electrical conduction cavity formed through the printing surface, and wherein the interconnect metal connects the ohmic heater to the TSV plug along a bottom of the conduction cavity.

5. The printhead die of claim 1, wherein the TSV plug comprises a doped and electrically-isolated portion of the SOI structure.

6. The printhead die of claim 1, wherein the UBM pad comprises a layer of evaporated metal.

7. The printhead die of claim 6, wherein the evaporated metal comprises titanium-nickel-gold.

8. The printhead die of claim 1, further comprising a dielectric layer disposed along the mounting surface and forming a soldering cavity exposing at least a portion of the UBM pad for connection to an external electrical source.

9. The printhead die of claim 1, wherein the ink-receiving structure comprises a single cavity.

10. The printhead die of claim 1, wherein the ink-receiving and ink-dispensing structure comprises: an ink-receiving cavity; a plurality of ink-dispensing pores formed in the SOI structure and oriented substantially normal to the printing surface to provide a flow path for the ink between the ink-receiving cavity and the print surface.

* * * * *